(12) United States Patent
Minzoni (10) Patent No.: US 7,279,946 B2
(45) Date of Patent: Oct. 9, 2007

(54) CLOCK CONTROLLER WITH INTEGRATED DLL AND DCC

(75) Inventor: Alessandro Minzoni, Morrisville, NC (US)

(73) Assignee: Infineon Technologies AG (DE)

( * ) Notice: Subject to any disclaimer, the term of this patent is extended or adjusted under 35 U.S.C. 154(b) by 135 days.

(21) Appl. No.: 11/215,779

(22) Filed: Aug. 30, 2005

(65) Prior Publication Data

US 2007/0046346 A1 Mar. 1, 2007

(51) Int. Cl.
*H03L 7/06* (2006.01)

(52) U.S. Cl. .................. 327/158; 327/149; 327/175

(58) Field of Classification Search ............... 327/149, 327/152, 153, 158, 175, 161–163
See application file for complete search history.

(56) References Cited

U.S. PATENT DOCUMENTS

| | | | | |
|---|---|---|---|---|
| 5,491,440 A | 2/1996 | Uehara et al. | ............. | 327/172 |
| 5,757,218 A | 5/1998 | Blum | ............. | 327/175 |
| 6,084,452 A | 7/2000 | Drost et al. | ............. | 327/175 |
| 6,125,157 A | 9/2000 | Donnelly et al. | ............. | 375/371 |
| 6,342,801 B1 | 1/2002 | Shin | ............. | 327/175 |
| 6,452,432 B2 | 9/2002 | Kim | ............. | 327/158 |
| 6,459,314 B2 | 10/2002 | Kim | ............. | 327/161 |
| 6,501,313 B2 | 12/2002 | Boerstler et al. | ............. | 327/175 |
| 6,603,337 B2 | 8/2003 | Cho | ............. | 327/149 |
| 6,680,635 B2 * | 1/2004 | Lee | ............. | 327/158 |
| 6,768,361 B2 * | 7/2004 | Kwak | ............. | 327/158 |
| 6,853,225 B2 | 2/2005 | Lee | ............. | 327/149 |
| 6,859,081 B2 | 2/2005 | Hong et al. | ............. | 327/175 |
| 6,882,196 B2 | 4/2005 | Yee et al. | ............. | 327/175 |
| 6,943,604 B2 * | 9/2005 | Minzoni | ............. | 327/175 |
| 6,996,026 B2 * | 2/2006 | Brox et al. | ............. | 365/233 |
| 7,046,059 B2 * | 5/2006 | Kwak | ............. | 327/158 |
| 7,142,026 B2 * | 11/2006 | Kwak | ............. | 327/158 |

\* cited by examiner

*Primary Examiner*—Kenneth B. Wells
*Assistant Examiner*—Hai L. Nguyen
(74) *Attorney, Agent, or Firm*—Dicke, Billing, & Czaja & P.L.L.C.

(57) ABSTRACT

A clock controller for use with an off-chip driver and including a first delay element, a second delay element, a restore circuit, and an adjustment circuit. The clock controller includes a node receiving a reference clock represented by a least one clock signal. The first delay element is configured to delay one of the at least one clock signals by a first delay time, and the second delay element is configured to delay one of the at least one clock signals by a second delay time. The restore circuit is configured to provide at least a first output clock to the off-chip driver, wherein the off-chip driver provides output data based at least on the first output clock. The adjustment circuit is configured to adjust the first and second time delays to adjust edges of the first output clock such that output data from the off-chip driver aligns with edges of the reference clock, and to adjust the second delay time to maintain the first output clock at a desired duty cycle.

29 Claims, 6 Drawing Sheets

| I/D1 | | I/D2 | | I/D3 | |
|---|---|---|---|---|---|
| INC | DEC | INC | DEC | INC | DEC |
| 0 | 0 | 0 | 0 | 0 | 0 |
| 0 | 1 | 0 | 0 | 0 | 1 |
| 1 | 0 | 0 | 0 | 1 | 0 |
| 0 | 0 | 0 | 1 | 0 | 1 |
| 0 | 0 | 1 | 0 | 1 | 0 |
| 0 | 1 | 0 | 1 | 0 | 1 |
| 0 | 1 | 1 | 0 | 0 | |
| 1 | 0 | 0 | 1 | | |
| 1 | 0 | 1 | 0 | 1 | 0 |

CLOCK CONTROLLER WITH INTEGRATED DLL AND DCC

BACKGROUND

Many digital circuits, such as memory circuits, receive a reference clock from a host device to operate. Such circuits often employ an off-chip driver (OCD) to transfer output data to the host device. Due to propagation delays through the OCD and other circuit elements, timing differences may exist between the circuit and the host device so that the output data may not be aligned with the reference clock. To remedy this problem, delay locked loops (DLLs) are often employed to compensate for these timing differences so that output data from the OCD is aligned with the reference clock.

Memory circuits often operate in a differential environment with the reference clock comprising a clock signal and an inverted clock signal, with circuit timing being based on the rising edges of the clock and inverted clock signals. One conventional DLL employed by such a memory circuit delays the clock and inverted clock signals with a pair of adjustable delay elements to generate and provide an output clock to the off-chip driver so that output data is aligned with the reference clock. The delay elements are adjusted to compensate for memory circuit propagation delays (e.g. OCD and data path propagation delays) so as to maintain a desired phase relationship between the rising edges of the clock and inverted clock signals within the memory circuit.

In addition to aligning output data with the host reference clock, it is also important for a memory circuit to have a clock signal with a duty cycle of approximately fifty percent. This provides the memory circuit with approximately an equal amount of time on the high level phase and the low level phase for transferring data into and out of the memory circuit. However, reference clocks sometimes deviate from a 50% duty cycle. To address this problem, memory circuits generally employ duty cycle correctors (DCCs) adjust and maintain clock signals at a fifty percent duty cycle. One conventional DCC employs a pair of delay elements to delay both the clock and inverted clocks signals and adjusts one of the delay elements to maintain transitions between rising edges of the clock and inverted clock signals at approximately one-half a clock cycle.

To achieve output alignment with a host device and a clock duty cycle of fifty percent, memory and other circuits often employ a DLL and a DCC positioned in series with one another. While functionally effective, such configurations, particularly the variable delay elements, consume a large amount of space on an integrated circuit.

SUMMARY

Embodiments of the invention provide a circuit, and in one or more embodiments provide a memory circuit. In one embodiment, the present invention provides a clock controller for use with an off-chip driver and including a first delay element, a second delay element, a restore circuit, and an adjustment circuit. The clock controller includes a node receiving a reference clock represented by a least one clock signal. The first delay element is configured to delay one of the at least one clock signals by a first delay time, and the second delay element is configured to delay one of the at least one clock signals by a second delay time. The restore circuit is configured to provide at least a first output clock to the off-chip driver, wherein the off-chip driver provides output data based at least on the first output clock. The adjustment circuit is configured to adjust the first and second time delays to adjust edges of the first output clock such that output data from the off-chip driver aligns with edges of the reference clock, and to adjust the second delay time to maintain the first output clock at a desired duty cycle.

BRIEF DESCRIPTION OF THE DRAWINGS

Embodiments of the invention are better understood with reference to the following drawings. The elements of the drawings are not necessarily to scale relative to each other. Like reference numerals designate corresponding similar parts.

DETAILED DESCRIPTION

Figure 1:
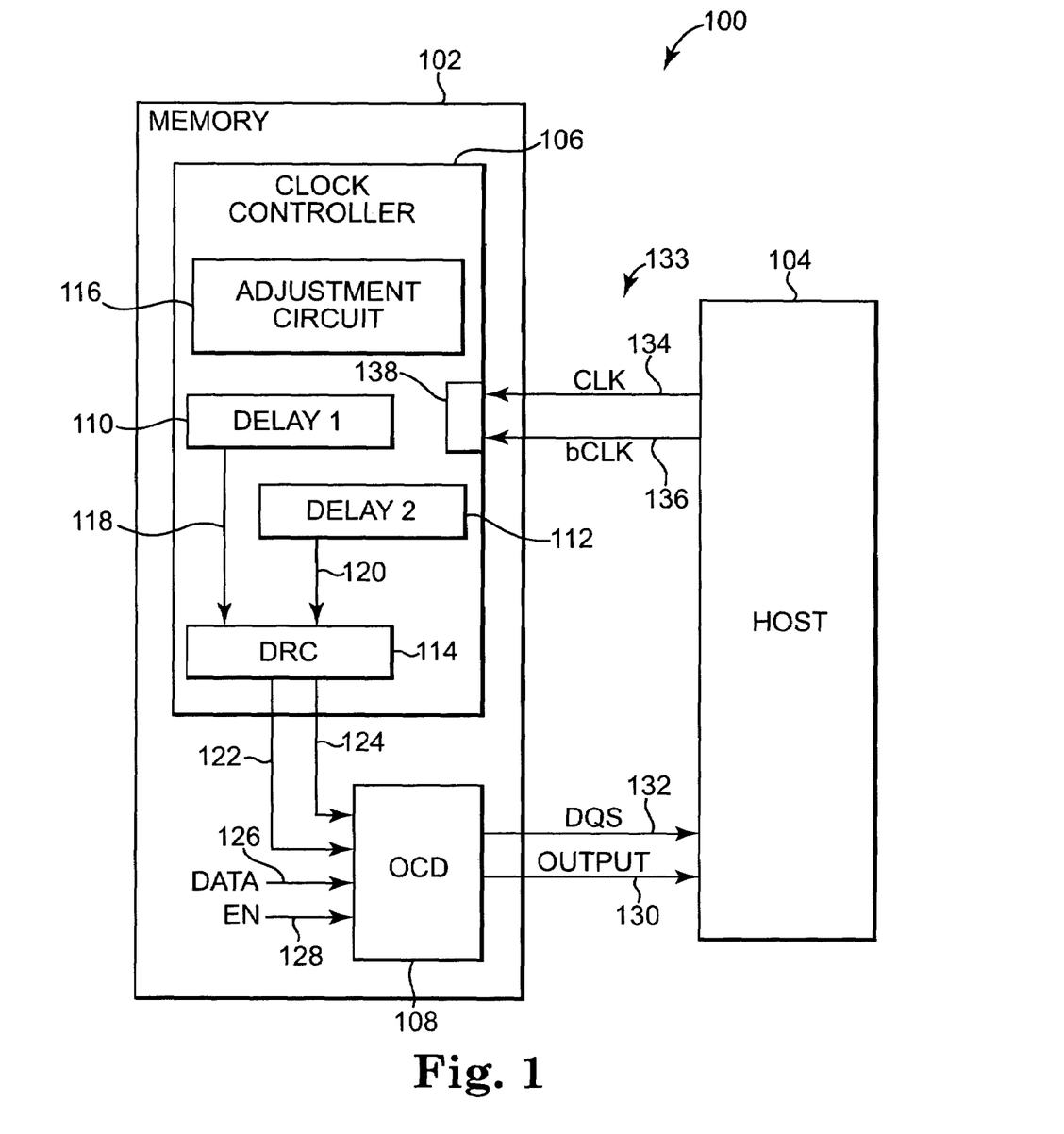
FIG. 1 is a block diagram illustrating a memory circuit employing a one embodiment of a clock controller according to the present invention coupled to a host.

FIG. 1 is a block diagram illustrating one embodiment of a system 100 comprising a memory circuit 102 coupled to a host 104. Memory circuit 102 includes a clock controller in accordance with the present invention which employs a single pair of delay elements to provide duty cycle correction and alignment of output data from memory circuit 102 with a reference clock of host 104. Memory circuit 102 includes a clock controller 106 and an off-chip driver (OCD) 108. In one embodiment, as illustrated, clock controller 106 includes a first delay element 110, a second delay element 112, a duty restoration circuit (DRC) 114, and an adjustment circuit 116. First and second adjustable delay elements 110, 112 are electrically coupled to DRC 114 via signal paths 118, 120, and DRC 114 is coupled to OCD 108 via signal paths 122, 124.

OCD 108 receives a data signal (DATA) on a data path 126 and an enable signal (EN) on an enable signal path 128. OCD 108 is electrically coupled to host 104 via an output signal path 130 and a DQS signal path 132. Host 104 provides a reference clock 133 to memory circuit 102. In one embodiment, as illustrated, reference clock 133 comprises a differential clock represented by a clock signal (CLK) and an inverted clock signal (bCLK) that are respectively received via a clock signal path 134 and an inverted clock signal path 136.

Clock controller 106 receives CLK and bCLK via a node 138. First delay element 110 receives and delays CLK by an adjustable delay time to provide a delayed clock signal (dCLK) via signal path 122. Second delay element 112 receives and delays bCLK by an adjustable delay time to provide a delayed inverted clock signal (dbCLK) via signal path 124. Based on dCLK and bdCLK, DRC 114 provides a data clock (dCLKA) and an inverted data clock (bdCLKA) via signal paths 122, 124.

Host 104 reads data from and writes data to memory circuit 102. The enable signal (EN) on enable signal path 128 enables OCD 108 during a read operation and disables OCD 108 during a write operation. In one embodiment, host 104 requests data from memory circuit 102 and enables OCD 108. In one embodiment, ODC 108 outputs logic high data from data signal path 126 to output signal path 130 in response to dCLKA received via signal path 122, and output logic low data from data signal path 126 to output signal path 130 in response to bdCLKA received via signal path 124.

In one embodiment, adjustment circuit 116 adjusts the delay times of first and second delay elements 110, 112 to align edges of dCLKA and bdCLKA with reference clock 133, and adjusts the delay time of second delay element 112 to maintain dCLKA and bdCLKA at a desired duty cycle. In one embodiment, adjustment circuit 116 adjusts the delay the time of second delay element 112 to maintain dCLKA and bdCLKA substantially at a 50% duty cycle.

Aligning the edges of dCLKA and bdCLKA with reference clock 133 aligns the output data provided by OCD 108 via output signal path 130 with reference clock 133 of host 104. Additionally, maintaining data clock signals dCLKA and bdCLKA at 50% duty cycles provides an equal amount of time for transferring logic high and logic low data from memory circuit 102 to host 104.

By adjusting the delay times of the first and second delay elements 110, 112 in this fashion, clock controller 106 according to the present invention provides duty cycle correction and alignment of output data from a corresponding circuit (e.g. memory circuit 102) with a reference clock of an associated host device (e.g. reference clock 133 of host 104). As such, a clock controller in accordance with the present invention functions as both a DLL and a DCC, but employs only two delay elements, thereby consuming less space on an integrated circuit and being less costly than a standard DLL and DCC combination.

Figure 2:
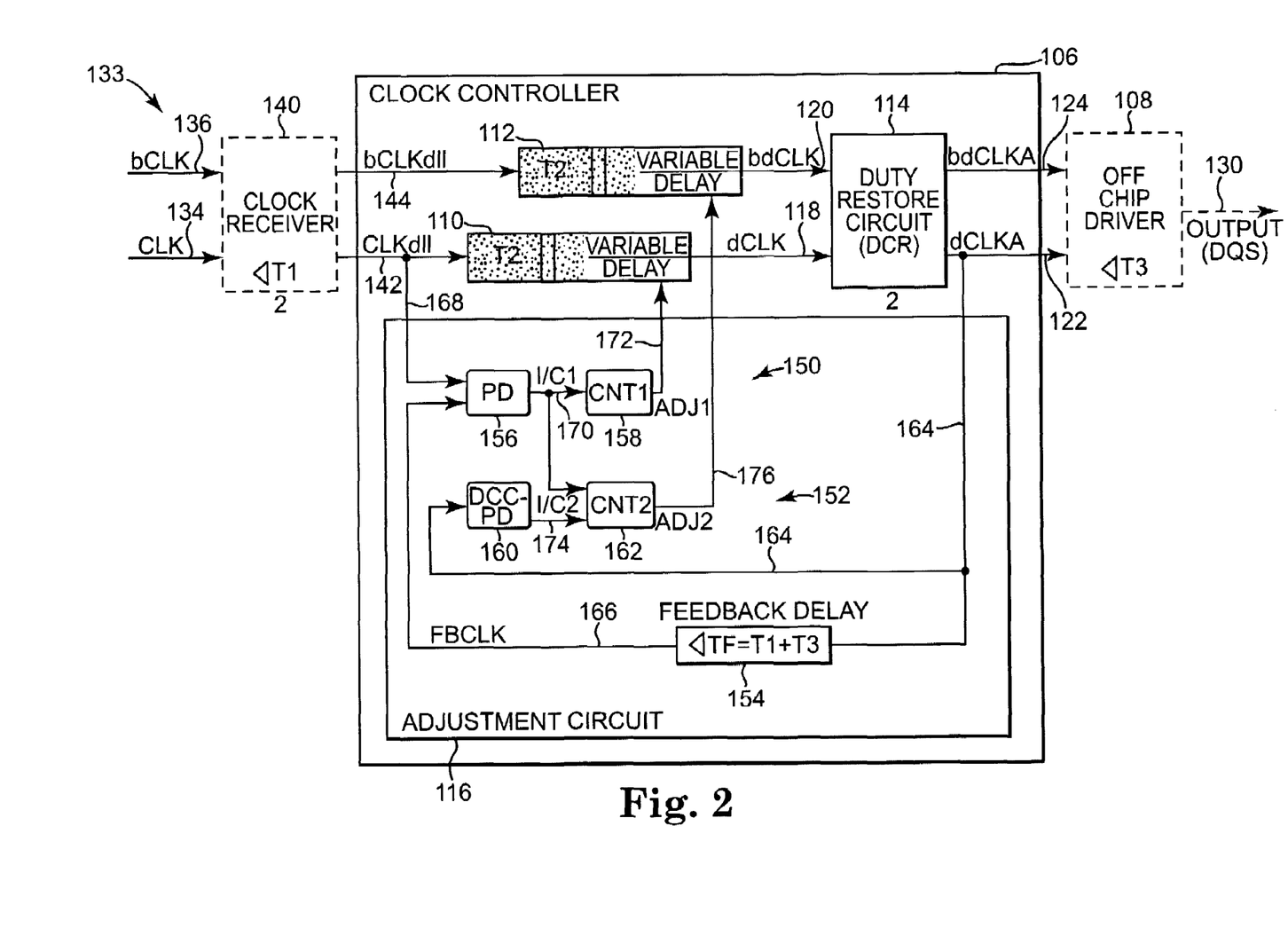
FIG. 2 is a schematic diagram illustrating one embodiment of a clock controller according to the present invention.

FIG. 2 is a block and schematic diagram illustrating one example embodiment of clock controller 106 according to the present invention. As illustrated, controller 106 is employed by memory circuit 102 of FIG. 1 which, in the illustrated embodiment, further includes a clock receiver circuit 140. Clock receiver circuit 140 receives differential clock signals CLK and bCLK via clock signal path 134 and inverted clock signal path 136, such as from host device 104 of FIG. 1, and re-drives CLK and bCLK to respectively provide a DLL clock (CLKdll) and an inverted DLL clock (bCLKdll) via signal paths 142 and 144. Clock signals CLKdll and bCLKdll are delayed from reference clock signals CLK and bCLK by a propagation delay (T1) introduced by clock receiver circuit 140. CLKdll and bCLKdll are not differential clock signals.

First and second delay element 110, 112 respectively receive CLKdll and bCLKdll via signal paths 142, 144. First delay element 110 delays CLKdll by a delay time (T2) to provide delayed clock signal dCLK, and second variable delay element 112 delays bCLKdll by a delay time (T2') to provide delayed inverted clock signal bdCLK. As will be described in greater detail below, T2' is substantially equal to T2 when reference clock 133 is operating at a 50% duty cycle.

Duty restore circuit 114 respectively receives dCLK and bdCLK via signal paths 118, 120 and provides data clock dCLKA and inverted data clock bdCLK via signals paths 122, 124. In one embodiment, DRC 114 provides dCLKA and bdCLKA based on the rising edges of dCLK and bdCLK, with the rising edge of bdCLK triggering the falling edge of dCLK and the rising edge of dCLK triggering the falling edge of bdCLK. Data clock dCLKA and inverted data clock bdCLKA are delayed from delayed clock signal dCLK and inverted delayed clock signal bdCLK by a propagation delay Tc through DRC 114.

Off-chip driver 108 receives dCLKA and bdCLKA via signal paths 122, 124. As described above with regard to FIG. 1, in one embodiment, OCD 108 outputs logic high data to output signal path 130 in response to dCLKA and outputs logic low data to output signal path 130 in response to bdCLKA. In one embodiment, OCD 108 outputs a data strobe signal (DQS) via output signal path 130 with DQS having rising edges aligned with rising edges of data clock dCLKA and falling edges aligned with rising edges of inverted data clock bdCLKA. As illustrated, off-chip driver 108 and other data path delays introduce a propagation delay (T3) through memory circuit 102.

Although there may be a skew between the rising and falling edge propagation delays a signal through memory circuit 102, it is assumed that the rising edge propagation delays between two signal, such as clock signal CLK and bCLK, are at a same skew. As such, in one embodiment, adjustment circuit 116 is configured to adjust delay times T2 and T2' of first and second delay elements 110, 112 by a substantially equal amount to adjust the rising edges of bdCLK and dCLK so as to align the edges of data clocks dCLKA and bdCLKA with the edges of reference clock 133, and to adjust only delay time T2' of second delay element 112 to adjust only the rising edge of bdCLK so as to maintain data clocks dCLKA and bdCLKA substantially at a 50% duty cycle.

In one embodiment, as illustrated, adjustment circuit 116 includes a first feedback circuit 150 configured to adjust delay time T2 of first delay element 110 and a second feedback circuit 152 to adjust delay time T2' of second delay elements 112. First feedback circuit 152 includes a feedback delay element 154, a delay-locked loop phase detector (DLL-PD) 156, and a first counter (CNT1) 158. Second feedback circuit 152 includes a duty cycle corrector phase detector (DCC-PD) 160 and a second counter (CNT2) 162.

Feedback delay element 154 receives dCLKA from DRC 114 via a feedback signal path 164 and delays dCLKA by a feedback delay time (Tf) to provide a feedback clock (FBCLK) via a signal path 166. Feedback delay Tf is equal to a sum of the propagation delays T1 and T3 respectively introduced by receiver 140 and off-chip driver 108 of memory circuit 102. Although the present embodiment illustrates Tf as being equal to the sum of propagation delays T1 and T3, the value of feedback delay Tf is adjusted to compensate for all delays through memory circuit 102 which are external to clock controller 106.

DLL-PD 156 receives FBCLK from feedback delay element 154 via signal path 166 and CLKdll from clock receiver 140 via a signal path 168 and provides a first increment/decrement signal (I/C 1) based on a phase difference between the rising edge of FBCLK and CLKdll. In one embodiment, for example, DLL-PD 156 provides I/D1 having a value indicating an increment (increase T2) when CLKdll is leading dCLKA and a decrement (decrease T2) when dCLKA is leading CLKdll. If FBCLK is substantially in phase with CLKdll, DLL-PD 156 provides I/D1 having a value indicating neither an increment nor a decrement.

CNT1 serves as a reference pointer for first delay element 110. CNT1 158 receives I/D1 from DLL-PD 156 via a signal path 170 and provides a first adjustment signal (ADJ1) via a path 172 to control the value of the delay time T2 of first delay element 110. In one embodiment, first delay element 110 provides one of a plurality of discrete delay values based on the value of ADJ1. In one embodiment, based on I/D1 from DLL-PD 156, CNT1 158 provides ADJ1 with a value so that the value of delay time T2 provided by first delay element 110 solves Equation I below:

$$N*Tcyc=T1+Tc+T2+T3 \quad \text{Equation I}$$

where:
T1=clock receiver propagation delay;
Tc=duty restore circuit propagation delay;
T2=delay time of first delay element;
T3=off-chip driver propagation delay;
Tcyc=cycle time of host clock; and
N=integer value.

Based on I/D1 from DLL-PD 156, CNT1 158 solves Equation I and provides ADJ1 with a coded value that is translated to a desired delay time T2 by first delay element 110.

DCC-PD 160 receives dCLKA from DRC 114 via feedback signal path 164 and provides a second increment/decrement signal (I/D2) based on the duty cycle of dCLKA, which comprises a ratio of the high clock time (Th) to the cycle time (Tcyc) of dCLKA. In one embodiment, for example, DCC-PD 160 provides I/D2 having a value indicating an increment (increase in T2') when the ratio is less than 50% and a decrement (decrease in T2') when the ratio is greater than 50%. If the duty cycle is substantially equal to 50%, DCC-PD 160 provides I/D2 having a value indicating neither an increment nor a decrement.

CNT2 162 serves as a reference pointer for second delay element 112. CNT2 162 receives I/D1 from DLL-PD 156 via signal path 170 and I/D2 from DCC-PD 160 via a signal path 174. Based on the values of I/D1 and I/D2, CNT2 162 provides a second adjustment signal (ADJ2) via a path 176 to control the value of the delay time T2' of second delay element 112. In one embodiment, second delay element 112 provides one of a plurality of discrete delay values based on the value of ADJ2. In one embodiment, based on the values of I/D1 and I/D2, CNT2 162 provides ADJ2 with a value such that the value of delay time T2' provided by second delay element 112 is represented by Equation II below:

$$T2'=T2-\delta \quad \text{Equation II}$$

where:
T2'=delay time of second delay element;
T2=delay time of first delay element (phase adjustment); and
δ=duty cycle delay adjustment.

In Equation II above, the value of δ is based on the output I/D2 of DCC phase detector 162. If the duty cycle of dCLKA is substantially equal to 50%, I/D2 provided by DCC-PD 160 indicates neither an increment nor a decrement, and the value of δ determined by CNT2 162 is equal to zero. In such an instance, CNT2 162 acts as a redundant counter to CNT1 158 and provides ADJ2 with a value based on Equation I and I/D1 received from DLL-PD 156 such that the value of delay time T2' provided by second delay element 112 is substantially equal to the value of delay time T2 provided by first delay element 112. As such, the rising edges of CLKdll and bCLKdll are delayed by substantially a same amount by first and second delay elements 110, 112 to respectively provide dCLK and bdCLK.

If CLKA is substantially in phase with CLK, I/D1 provided by DLL-PD 156 indicates neither an increment nor a decrement, and CNT2 adjusts the value of ADJ2, and thus the value of delay time T2' of second delay element 112, based on the value of I/D2 from DCC-PD 160. In one embodiment, for example, if the value of I/D2 indicates an increment (less than 50% duty cycle), CNT2 adjusts the value of ADJ2 such that delay time T2' is increased by δ (i.e., T2'>T2). Similarly, if the value of I/D2 indicates a decrement (duty cycle exceeds 50%), CNT2 adjusts the value of ADJ2 such that delay time T2' is decreased by δ (i.e., T2'<T2).

In some instances, both I/D1 provided by DLL-PD 156 and I/D2 provided by DCC-PD 160 may simultaneously indicate an increment or a decrement. In one embodiment, when such a scenario arises, CNT2 162 initially ignores the increment/decrement indicated by I/D2 from DCC-PD 160 and provides ADJ2 to adjust T2' based only on I/D1 from DLL-PD 156. First adjusting T2' for phase alignment based on I/D1 in this fashion does not alter the duty cycle distortion of reference clock 133. As such, after adjusting T2' based only I/D1, CNT2 162 adjusts T2' based only on I/D2 from DCC-PD 160.

Figure 3A:
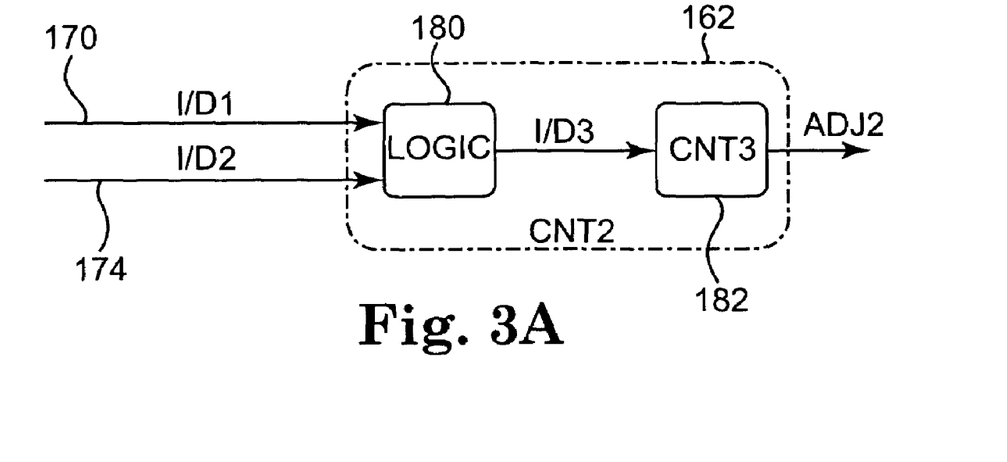
FIG. 3A is a schematic diagram illustrating one embodiment of a counter employed by the clock controller of FIG. 2.
Figure 3B:
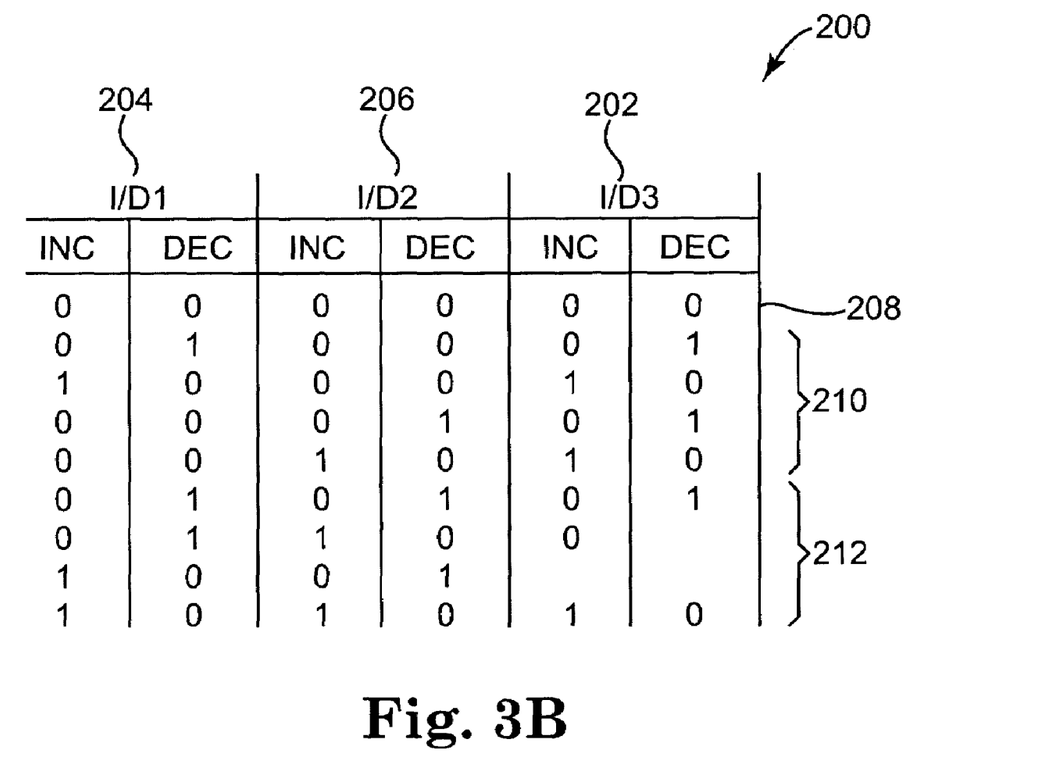
FIG. 3B illustrates a logic table representative of the operation of the counter of FIG. 3A.

FIGS. 3A and 3B illustrate one embodiment of counter CNT2 162 of FIG. 2. FIG. 3A is a block diagram illustrating generally one example implementation of CNT2 162. CNT2 162 includes a logic circuit 180 and a third counter (CNT3) 182. Logic circuit 180 receives I/D1 from DLL-PD 156 via signal path 170 and I/D2 from DCC-PD 160 via signal path 174. Logic circuit 180 provides a third increment/decrement signal (I/D3) to CNT3 182 via a signal path 184 with a value based on the values of I/D1 and I/D2. In-turn, CNT3 provides ADJ2 to increase or decrease T2' of second delay element 112 based on the value of I/D3.

FIG. 3B is a logic table 200 illustrating the operation of one embodiment of logic circuit 180. The increment (INC) and decrement (DEC) values of I/D3 are illustrated in column 202 and are based on the INC and DEC values of I/D1 and I/D2 which are respectively illustrated in columns 204 and 206. As illustrated at 208, when neither I/D1 nor I/D2 indicate neither an INC nor a DEC, logic circuit 180 provides I/D3 indicating neither an NEC nor a DEC. As illustrated at 210, when either I/D1 or I/D2 indicate either an INC or a DEC, logic circuit 180 provides I/D3 indicating a corresponding INC or DEC. As illustrated at 212, when both I/D1 and I/D2 indicate either an INC or a DEC, logic circuit 180 first provides I/D3 indicating an INC or DEC in response to I/D1. As described above with respect to FIG. 2, but not illustrated in FIG. 3B, I/D3 subsequently provides I/D3 for duty cycle correction based on I/D2.

Figure 4:
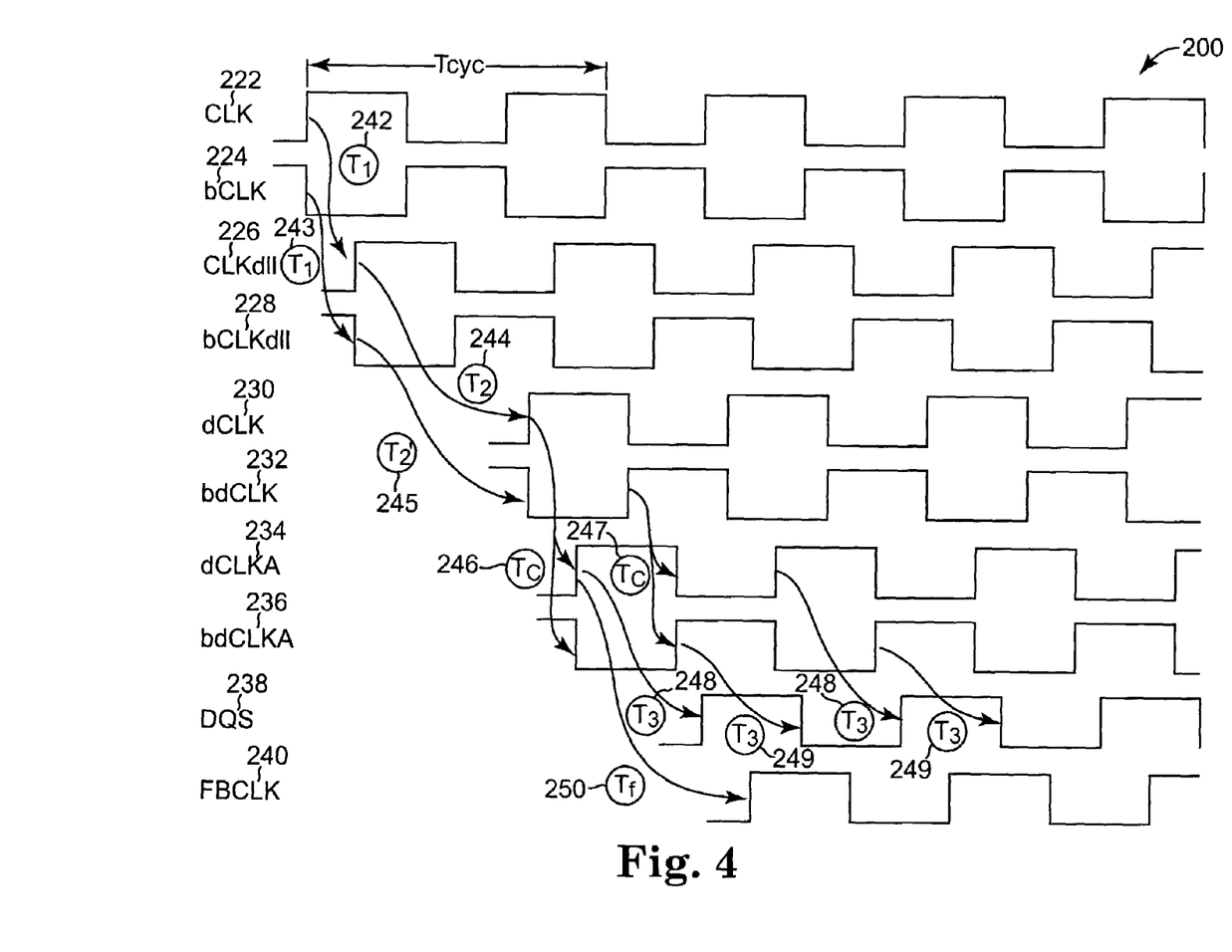
FIG. 4 is a timing diagram illustrating one embodiment of the timing of signals for the memory circuit of FIG. 1.

FIG. 4 is an example timing diagram 220 illustrating the operation of clock controller 106 in aligning data clock dCLKA, inverted data clock bdCLKA, and data strobe DQS with reference clock 133. In the illustrative example, the duty cycle of reference clock 133 is at 50% such that T2 and T2' are substantially equal. Timing diagram 220 includes reference clock signal CLK 222 on clock signal path 134, inverted reference clock signal bCLK 224 on inverted clock signal path 136, DLL clock signal CLKdll 226 on signal path 142, inverted DLL clock signal bCLKdll 228 on signal path 144, delayed clock signal dCLK 230 on signal path 118, inverted delayed clock signal bdCLK 232 on signal path 120, data clock dCLKA 234 on signal path 122, inverted data clock bdCLKA 236 on signal path 124, data strobe signal DQS 238 on output signal path 130, and feedback clock FBCLK on signal path 166.

Receiver 140 receives and re-drives differential reference clocks CLK and dCLK to provide CLKdll and bCLKdll which are each delayed by delay T1, as illustrated respectively at 242 and 243. First delay element 110 delays CLKdll by delay T2 and second delay element 112 delays bCLKdll by delay T2', as respectively illustrated at 244 and 245. In the illustrated example, the duty cycle of reference clock 133 is 50% such that delay T2 is substantially equal to delay T2'. DRC 114 provides dCLKA and bdCLKA with dCLKA having rising edges based on rising edges of CLKdll and falling edges based on rising edges of bCLKdll and bdCLKA having rising edges based on rising edges of bdCLK and falling edges based on rising edges of dCLK. DRC 114 delays the rising edges of dCLKA and falling edges of bdCLKA by delay Tc from the rising edges of dCLK, as illustrated at 246, and delays the rising edges of bdCLKA and the falling edges of dCLKA by delay Tc from the rising edges of bdCLK, as illustrated at 247.

OCD 108 provides DQS with rising edges delayed by T3 from the rising edges of dCLKA, as illustrated at 248, and falling edges delayed by T3 from the rising edges of bdCLKA, as illustrated at 249. In this fashion, the edges of DQS are aligned with the edges of reference clock signal CLK, as indicated at 250. Feedback delay element 154 delays dCLKA by delay Tf (i.e. T1+T3), as indicated at 252, to provide FBCLK which is aligned with CLKdll, as indicated at 254.

Figure 5:
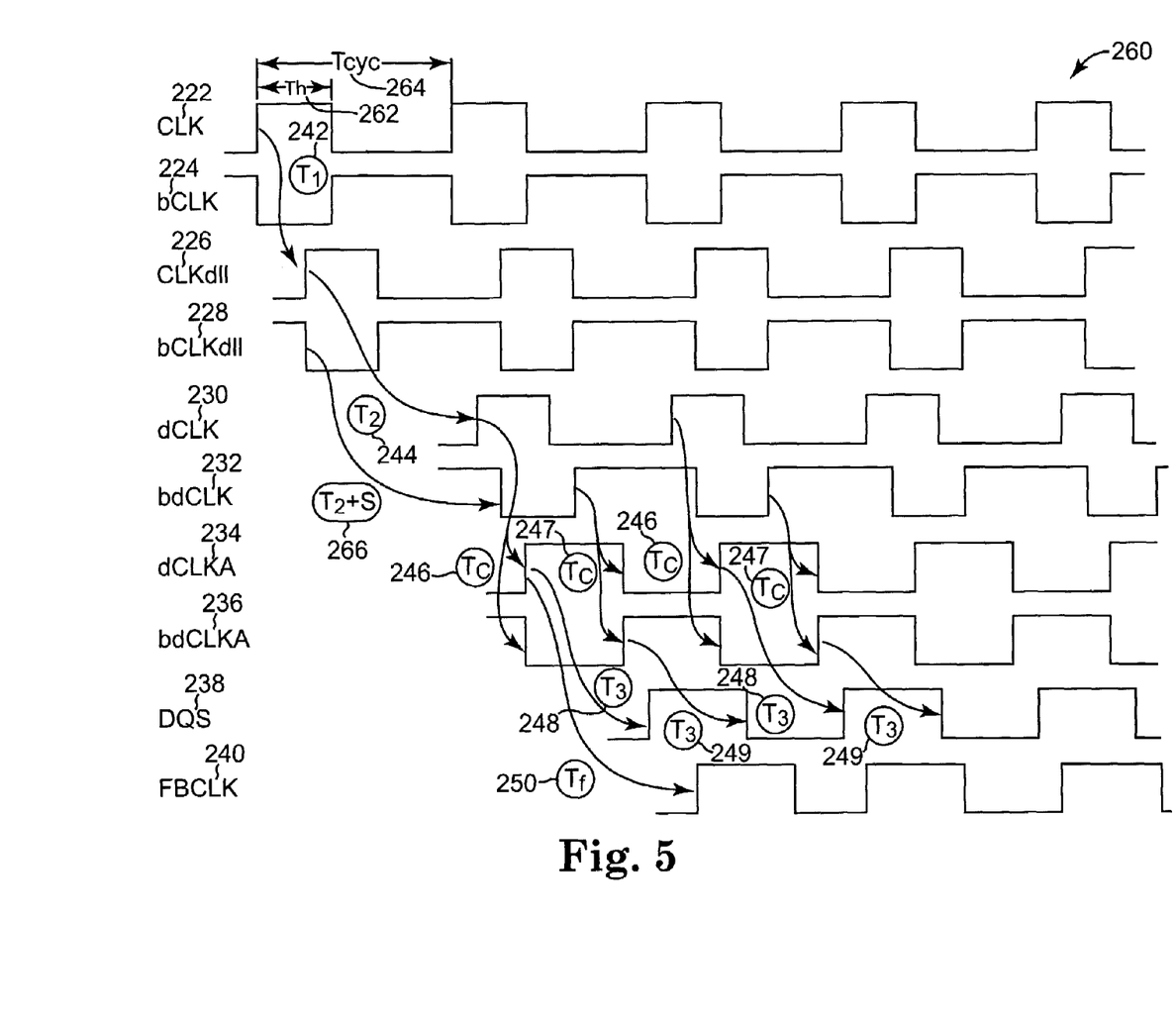
FIG. 5 is a schematic diagram illustrating another embodiment of a clock controller according to the present invention.
Figure 6:
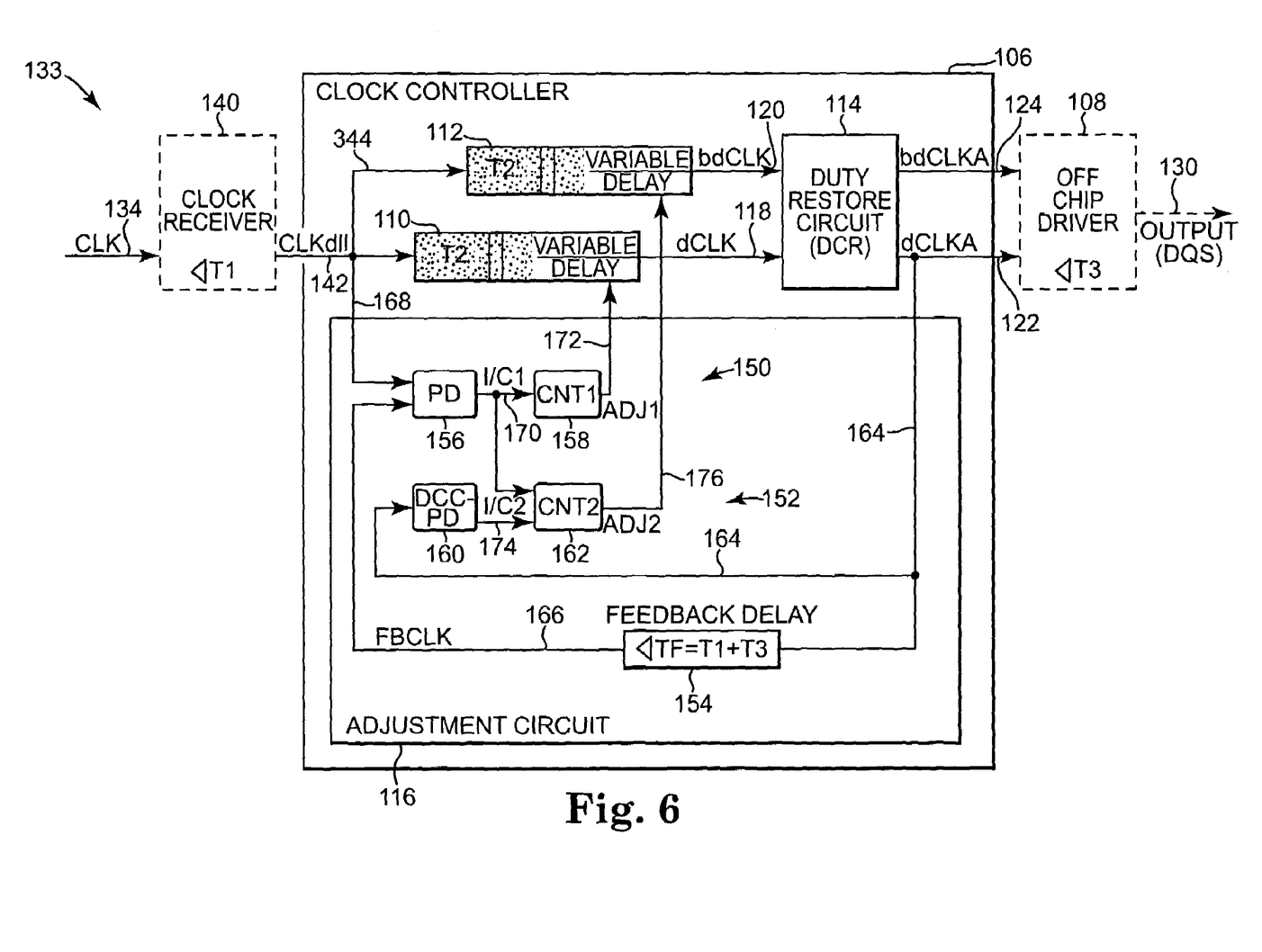
FIG. 6 is a schematic diagram illustrating one embodiment of a clock controller according to the present invention.

FIG. 5 is an example timing diagram 260 illustrating the operation of clock controller 106 in providing duty cycle correction so as to maintain data clock dCLKA, inverted data clock bdCLKA, and data strobe DQS substantially at a 50% duty cycle when reference clock 133 varies from a 50% duty cycle. In the illustrative example of FIG. 5, the duty cycle of reference clock 133 is less than 50%.

In a fashion similar to that described above with respect to FIG. 4, receiver 140 receives and re-drives differential reference clocks CLK and dCLK to provide CLKdll and bCLKdll which are each delayed by delay T1, as illustrated respectively at 242 and 243. First delay element 110 delays CLKdll by delay T2 and second delay element 112 delays bCLKdll by delay T2', as respectively illustrated at 244 and 266. However, unlike the situation illustrated above by FIG. 4, the duty cycle of reference clock 133 is less than 50%. As illustrated by FIG. 5, the logic high time (Th) 262 is less than 50% of the cycle time (Tcyc) 264 of CLK 222. In this situation, T2' is not equal to T2, but as illustrated at 266, is greater than T2 by the amount δ, wherein the value of δ is determine by CNT2 162 based on the duty cycle of dCLKA as determined by DCC-PD 160. In the situation where the duty cycle of reference clock 133 is greater than 50%, the value of δ is such that T2' is less than T2 by the value of δ.

DRC 114 provides dCLKA and bdCLKA with dCLKA having rising edges based on rising edges of CLKdll and falling edges based on rising edges of bCLKdll and bdCLKA having rising edges based on rising edges of bdCLK and falling edges based on rising edges of dCLK. DRC 114 delays the rising edges of dCLKA and falling edges of bdCLKA by delay Tc from the rising edges of dCLK, as illustrated at 246, and delays the rising edges of bdCLKA and the falling edges of dCLKA by delay Tc from the rising edges of bdCLK, as illustrated at 247. By delaying bCLKdll by the amount δ in this fashion, clock dCLKA 234 and inverted data clock bdCLKA 236 have a duty cycle of substantially 50%.

OCD 108 provides DQS with rising edges delayed by T3 from the rising edges of dCLKA, as illustrated at 248, and falling edges delayed by T3 from the rising edges of bdCLKA, as illustrated at 249. In this fashion, the edges of DQS are aligned with the edges of reference clock signal CLK, as indicated at 250. Feedback delay element 154 delays dCLKA by delay Tf (i.e. T1+T3), as indicated at 252, to provide FBCLK which is aligned with CLKdll, as indicated at 254.

In some instances, there may be a high amount of jitter on the falling edge of CLK (i.e. rising edge of bCLK) of reference clock 133 received from the host (see FIG. 2). FIG. 5 is a block diagram illustrating an alternate embodiment 306 of a clock controller according to the present invention wherein the falling edge of the output data clocks does not depend on the inverted clock signal of the reference clock.

Clock controller 306 includes components similar to the components of clock controller 106 of FIG. 2 with the exception that clock controller 306 receives only CLKdll via signal path 142 from clock receiver 140. Instead of receiving bCLKdll from clock receiver 140, second delay element 112 receives CLKdll via a signal path 344. Additionally, rather than being described by Equation II, delay time T2' provided by second delay element 112 is described by Equation III below:

$$T2'=T2+\tfrac{1}{2}(Tcyc)-\delta \qquad \text{Equation II}$$

where:
T2'=adjustable delay time of second delay element;
T2=delay time of first delay element (phase adjustment);
Tcyc=cycle time of reference clock; and
δ=duty cycle delay adjustment.

In Equation II above, the value of δ is based on the output I/D2 of DCC-PD 160.

The present invention provides a clock controller employing a single pair of delay elements that provides both duty cycle correction and alignment of output data from a corresponding circuit (e.g. memory circuit 102) with a reference clock of an associated host device (e.g. reference clock 133 of host 104). As such, a clock controller in accordance with the present invention functions as both a DLL and a DCC, but employs only two delay elements, thereby consuming less space on an integrated circuit and being less costly than a standard DLL and DCC combination.

By adjusting the delay times of the first and second delay elements 110, 112 in this fashion, clock controller 106 according to the present invention provides duty cycle correction and alignment of output data from a corresponding circuit (e.g. memory circuit 102) with a reference clock of an associated host device (e.g. reference clock 133 of host 104). As such, a clock controller in accordance with the present invention functions as both a DLL and a DCC, but employs only two delay elements, thereby consuming less space on an integrated circuit and being less costly than a standard DLL and DCC combination.

What is claimed is:

1. A clock controller for use with an off-chip driver, the clock controller comprising:
   a node receiving a reference clock represented by at least one clock signal;
   a first delay element configured to delay one of the at least one clock signals by a first delay time to provide a first delayed clock;
   a second delay element configured to delay one of the at least one clock signals by a second delay time to provide a second delayed clock;
   a restore circuit configured to provide to the off-chip driver at least a first output clock based on the first and second delayed clock, wherein the off-chip driver provides output data based at least on the first output clock; and
   an adjustment circuit configured to adjust the first and second delay times so as to adjust edges of the first output clock such that output data from the off-chip driver aligns with edges of the reference clock, and to adjust the second delay time to maintain the first output clock at a desired duty cycle.

2. The clock controller of claim 1, wherein the adjustment circuit adjusts the first and second delay times based at least partially on a propagation delay of the off-chip driver.

3. The clock controller of claim 1, wherein the adjustment circuit adjusts the first and second time delays by substantially a same amount to adjust edges of the first output clock so that output data from the off-chip driver aligns with edges of the reference clock.

4. The clock controller of claim 1, wherein the first delay time is substantially equal to the second delay time when the reference clock has a duty cycle substantially equal to fifty percent.

5. The clock controller of claim 1, wherein the adjustment circuit adjusts the second delay time to maintain the first output clock at a desired duty cycle based on a duty cycle of the first output clock.

6. The clock controller of claim 1, wherein the desired duty cycle is a fifty percent duty cycle.

7. The clock controller of claim 1, wherein the reference clock comprises a differential clock including a host clock and an inverted host clock, and wherein the one of the at least one clock signals delayed by the first delay element comprises the host clock and the one of the at least one clock signals delayed by the second delay element comprises the inverted host clock.

8. A memory comprising:
an off-chip driver configured to output data based on a first and a second data clock;
a clock controller including:
a first variable delay configured to receive and delay a clock signal to provide a first delayed clock;
a second variable delay configured to receive and delay an inverted clock signal to provide a second delayed clock;
a restore circuit configured to provide the first and the second data clocks based on the first and second delayed clocks; and
an adjustment circuit configured to delay the first data clock by a feedback delay to form a feedback clock, to adjust the first and second variable delays based on a phase difference between the clock signal and feedback clock so that the output data is aligned with the clock signal, and to adjust the second variable delay based on a duty cycle of the first data clock so as to maintain the first and second data clocks substantially at a fifty percent duty cycle.

9. The memory circuit of claim 8, wherein the feedback delay is at least equal to a propagation delay of the off-chip driver.

10. The memory circuit of claim 8, wherein the feedback delay is substantially equal to propagation delays internal to the memory circuit but external to the clock controller.

11. The memory circuit of claim 8, wherein the adjustment circuit includes a first feedback circuit comprising:
a feedback delay element configured to delay the first data clock by the feedback delay to form the feedback clock;
a first phase detector configured to determine the phase difference between the clock signal and the feedback clock and to provide a first control signal based on the phase difference; and
a first counter configured to adjust the first variable delay based on the first control signal.

12. The memory circuit of claim 11, wherein the adjustment circuit includes a second feedback circuit comprising:

a second phase detector configured to determine a duty cycle of the first data clock and to provide a second control signal based on the duty cycle; and
a second counter configured to adjust the second variable delay based on the first and second control signals.

13. The memory circuit of claim 8, including a receiver circuit configured to receive and re-drive a reference clock to provide the clock signal and inverted clock signal, and wherein the adjustment circuit is figured to adjust the first and second variable delays based on the phase difference between the clock signal and the feedback signal so that the output data is aligned with the reference clock.

14. The memory circuit of claim 13, wherein the feedback delay is substantially equal to a sum of a propagation delay of the off-chip driver and a propagation delay of the receiver circuit.

15. A memory comprising:
an off-chip driver configured to output data based on a first and a second data clock;
a clock controller including:
a first variable delay configured to receive and delay an input clock signal by a first delay time to provide a first delayed clock;
a second variable delay configured to receive and delay the input clock signal by a second delay time to provide a second delayed clock;
a restore circuit configured to provide the first and the second data clocks based on the first and second delayed clocks; and
an adjustment circuit configured to delay the first data clock by a feedback delay to form a feedback clock, to adjust the first and second delay times based on a phase difference between the clock signal and feedback clock so that the output data is aligned with edges of the input clock signal, and to adjust the second delay time based on a duty cycle of the first data clock so as to maintain the first and second data clocks substantially at a fifty percent duty cycle.

16. The memory of claim 15, wherein the second delay time is substantially equal to the first delay time plus an amount of time substantially equal to one-half of a cycle time of the input clock signal when the duty cycle of the first data clock is substantially equal to fifty-percent.

17. The memory of claim 15, wherein the feedback delay is substantially equal to a propagation delay of the off-chip driver.

18. The memory of claim 16, including a receiver circuit configured to receive and re-drive a host clock to provide the input clock signal, wherein the adjustment circuit is figured to adjust the first and second variable delays based on the phase difference between the clock signal and the feedback signal so that the output data is aligned with the host clock, and wherein the feedback delay is substantially equal to a sum of a propagation delay of the off-chip driver and a propagation delay of the receiver circuit.

19. A method of operating a memory comprising:
receiving a host clock and an inverted host clock;
delaying the host clock by a first delay time to provide a first delayed clock;
delaying the inverted host clock by a second delay time to provide a second delayed clock;
providing a first data clock and a second data clock based on the first and second delayed clocks;
providing output data with an off-chip driver based on the first and the second data clocks;

adjusting the first and second time delays by substantially a same amount to align the output data with the host clock; and adjusting the second time delay to maintain the first and second data clocks substantially at a fifty percent duty cycle.

20. The method of claim 19, wherein adjusting the first and second time delays to align the output data with the host clock includes:

delaying the first data clock by a feedback delay to provide a feedback clock, wherein the feedback delay is substantially equal to a propagation delay of the off-chip driver;

determining a phase difference between the host clock and the feedback clock; and adjusting the first and second time delays by an amount based on the phase difference.

21. The method of claim 20, wherein adjusting the second delay time to maintain a duty cycle of substantially fifty percent includes:

determining a duty cycle of the first data clock; and adjusting the second time delay based on the duty cycle of the first data clock.

22. The method of claim 21, wherein the first and second delay times are substantially equal when the first data clock is substantially at a fifty percent duty cycle.

23. The method of claim 21, wherein receiving the host clock and inverted host clock includes:

re-driving the host clock and inverted host clock with a receiver circuit to provide a delayed host clock and an inverted delayed host clock, wherein providing the first delayed clock comprises delaying the delayed host clock by the first delay time, wherein providing the second delayed clock comprises delaying the inverted delayed host clock by the second time delay, and wherein the feedback delay is substantially equal to a sum of the propagation delay of the off-chip driver and a propagation delay of the receiver circuit.

24. A method of operating a memory circuit, the method comprising:

receiving and re-driving a host clock with a receiver circuit to provide a delayed host clock;

delaying the delayed host clock by a first delay time to provide a first delayed clock;

delaying the delayed host clock by a second delay time to provide a second delayed clock;

providing a first data clock and a second data clock based on the first and second delayed clocks;

providing output data with an off-chip driver based on the first and second data clocks;

delaying the first data clock by a feedback delay to provide a feedback clock, wherein the feedback delay is substantially equal to a sum of a propagation delay of the receiver circuit and a propagation delay of the off-chip driver;

adjusting the first and second delay times by an amount based on a phase difference between the first data clock and the delayed host clock such that the output data is aligned with the host clock; and adjusting the second delay time based on a duty cycle of the first data clock to maintain the first and second data clocks substantially at a fifty percent duty cycle, wherein the first and second delay times are substantially equal when the first data clock has substantially a fifty percent duty cycle.

25. A memory comprising:

means for receiving a host clock and an inverted host clock;

means for delaying the host clock by a first delay time to provide a first delayed clock;

means for delaying the inverted host clock by a second delay time to provide a second delayed clock;

means for providing a first data clock and a second data clock based on the first and second delayed clocks;

means for outputting data based on the first and the second data clocks;

means for adjusting the first and second time delays by substantially a same amount to align the data with the host clock; and means for adjusting the second time delay to maintain the first and second data clocks substantially at a fifty percent duty cycle.

26. The method of claim 25, wherein the means for adjusting the first and second time delays to align the output data with the host clock includes:

means for delaying the first data clock by a feedback delay to provide a feedback clock, wherein the feedback delay is substantially equal to a propagation delay of the means for outputting data;

means for determining a phase difference between the host clock and the feedback clock; and means for adjusting the first and second time delays by an amount based on the phase difference.

27. The method of claim 26, wherein the means for adjusting the second delay time to maintain a duty cycle of substantially fifty percent includes:

means for determining a duty cycle of the first data clock; and means for adjusting the second time delay based on the duty cycle of the first data clock.

28. The method of claim 27, wherein the first and second delay times are substantially equal when the first data clock is substantially at a fifty percent duty cycle.

29. The method of claim 27, wherein the means for receiving the host clock and inverted host clock includes:

means for re-driving the host clock and inverted host clock with a receiver circuit to provide a delayed host clock and an inverted delayed host clock, wherein the means for providing the first delayed clock comprises means for delaying the delayed host clock by the first delay time, wherein the means for providing the second delayed clock comprises means for delaying the inverted delayed host clock by the second time delay, and wherein the feedback delay is substantially equal to a sum of the propagation delay of the means for outputting data and a propagation delay of the means for re-driving the host clock.

* * * * *